United States Patent
Zhang

(10) Patent No.: US 12,188,981 B2
(45) Date of Patent: Jan. 7, 2025

(54) OSCILLATION PERIOD DETECTION CIRCUIT AND METHOD, AND SEMICONDUCTOR MEMORY

(71) Applicant: CHANGXIN MEMORY TECHNOLOGIES, INC., Anhui (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 169 days.

(21) Appl. No.: 17/737,116

(22) Filed: May 5, 2022

(65) Prior Publication Data

US 2023/0071369 A1    Mar. 9, 2023

Related U.S. Application Data

(63) Continuation of application No. PCT/CN2021/128356, filed on Nov. 3, 2021.

(30) Foreign Application Priority Data

Aug. 27, 2021   (CN) .................. 202110993836.6

(51) Int. Cl.
  *G01R 31/317*  (2006.01)
  *H03K 3/037*   (2006.01)
  *H03K 19/20*   (2006.01)

(52) U.S. Cl.
  CPC ....... *G01R 31/31727* (2013.01); *H03K 3/037* (2013.01); *H03K 19/20* (2013.01)

(58) Field of Classification Search
  CPC ............ G01R 31/317; G01R 31/31727; G01R 23/10; H03K 19/20; H03K 3/037; H03K 5/19

(Continued)

(56) References Cited

U.S. PATENT DOCUMENTS

| 5,487,097 A * | 1/1996 | Hatakenaka ......... G01R 23/005 377/55 |
| 2008/0297202 A1 * | 12/2008 | Takita ..................... H03K 5/19 327/42 |

(Continued)

FOREIGN PATENT DOCUMENTS

| CN | 101335522 A | 12/2008 |
| CN | 103886913 A | 6/2014 |

(Continued)

OTHER PUBLICATIONS

International Search Report cited in PCT/CN2021/128356, mailed on May 25, 2022, 5 pages.

(Continued)

*Primary Examiner* — Alesa Allgood
*Assistant Examiner* — Courtney G McDonnough
(74) *Attorney, Agent, or Firm* — Kilpatrick Townsend & Stockton LLP

(57) ABSTRACT

An oscillation period detection circuit and method, and semiconductor memory are provided. The oscillation period detection circuit includes an oscillator module, a control module, and a counting module. The oscillator module includes a target oscillator, and is configured to receive an enable signal and control the target oscillator to output an oscillation clock signal according to the enable signal; the control module is configured to receive the enable signal and the oscillation clock signal, and perform valid time reforming processing according to the oscillation clock signal and the enable signal to determine a target time; the counting module is configured to receive the enable signal and the oscillation clock signal, and perform period counting processing according to the enable signal and the oscillation clock signal to determine a target period number. The (Continued)

oscillation period of the target oscillator is calculated according to the target time and the target period number.

14 Claims, 6 Drawing Sheets

(58) Field of Classification Search
USPC .................................................. 324/76.11
See application file for complete search history.

(56) References Cited

U.S. PATENT DOCUMENTS

| | | |
|---|---|---|
| 2008/0315921 A1 | 12/2008 | Cha et al. |
| 2016/0308491 A1* | 10/2016 | Elgaard ..................... H03L 3/00 |
| 2019/0198075 A1 | 6/2019 | Lee et al. |
| 2019/0385654 A1 | 12/2019 | Lee et al. |

FOREIGN PATENT DOCUMENTS

| | | |
|---|---|---|
| CN | 106291148 A | 1/2017 |
| CN | 111341376 A | 6/2020 |
| JP | H05328219 A | 12/1993 |
| JP | 2003329740 A | 11/2003 |
| JP | 2008299731 A | 12/2008 |
| JP | 2013232831 A | 11/2013 |

OTHER PUBLICATIONS

First Office Action of the Taiwanese application No. 111120478, issued on Feb. 2, 2023, 9 pages.
Japanese Patent Office, Office Action Issued in Application No. 2023-535602, Aug. 6, 2024, 8 pages.

* cited by examiner

OSCILLATION PERIOD DETECTION CIRCUIT AND METHOD, AND SEMICONDUCTOR MEMORY

CROSS-REFERENCE TO RELATED APPLICATION

This is a continuation application of International Patent Application No. PCT/CN2021/128356, filed on Nov. 3, 2021, which claims priority to Chinese patent application No. 202110993836.6, filed on Aug. 27, 2021 and entitled "OSCILLATION PERIOD DETECTION CIRCUIT AND METHOD, AND SEMICONDUCTOR MEMORY". The disclosures of International Patent Application No. PCT/CN2021/128356 and Chinese patent application No. 202110993836.6 are hereby incorporated by reference in their entireties.

BACKGROUND

Dynamic Random Access Memory (DRAM) is a semiconductor memory device commonly used in computers, and is composed of many repeated memory cells. In DRAM, it needs to use an oscillator to generate a regular timing signal, and control a plurality of memory cells according to the timing signal. Therefore, the period detection of the oscillator is an important part of the chip quality detection.

However, in the related art, the method for detecting the duration of the oscillation period still has shortcomings, resulting in low detection accuracy and low detection efficiency.

SUMMARY

The present disclosure relates to the technical field of electronic measurement, and in particular, to an oscillation period detection circuit and method, and semiconductor memory, which can improve the detection accuracy and detection efficiency of the oscillation period.

The technical solution of the present disclosure is realized as follows.

In the first aspect, the embodiments of the present disclosure provide a oscillation period detection circuit. The circuit includes an oscillator module, a control module, and a counting module.

The oscillator module includes a target oscillator, and is configured to receive an enable signal and control the target oscillator to output an oscillation clock signal according to the enable signal.

The control module is configured to receive the enable signal and the oscillation clock signal, and perform valid time reforming processing according to the oscillation clock signal and the enable signal to determine a target time.

The counting module is configured to receive the enable signal and the oscillation clock signal, and perform period counting processing according to the enable signal and the oscillation clock signal to determine a target period number.

An oscillation period of the target oscillator is calculated according to the target time and the target period number.

In the second aspect, the embodiments of the present disclosure provide a method for detecting an oscillation period. The method is applied to an oscillation period detection circuit including a target oscillator, and the method includes the following operations.

The target oscillator is controlled to output an oscillation clock signal according to an enable signal.

Valid time reforming processing is performed according to the oscillation clock signal and the enable signal to determine a target time.

Period counting processing is performed according to the enable signal and the oscillation clock signal to determine a target period number.

The target time and the target period number are calculated to determine an oscillation period of the target oscillator.

In the third aspect, the embodiments of the present disclosure provide a semiconductor memory. The semiconductor memory includes at least the oscillation period detection circuit described in the first aspect.

DETAILED DESCRIPTION

Figure 1:
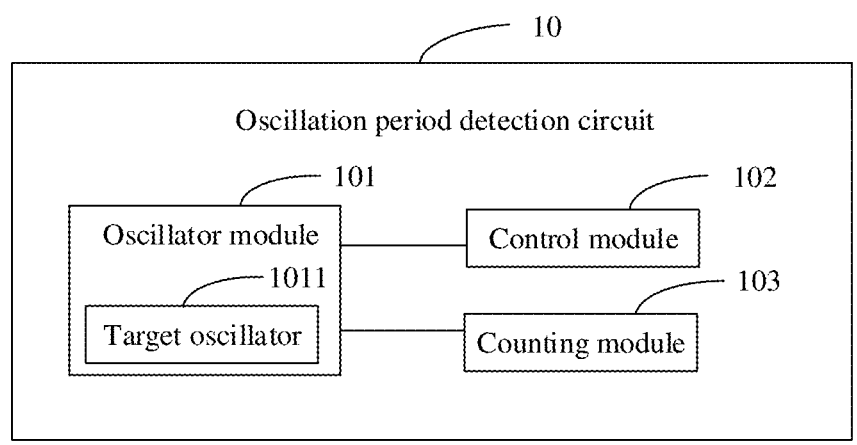
FIG. 1 illustrates a schematic diagram of a structure of an oscillation period circuit according to an embodiment of the present disclosure.

The technical solutions in the embodiments of the present disclosure will be clearly and completely described below with reference to the accompanying drawings in the embodiments of the present disclosure. It should be understood that the specific embodiments described herein are only used to explain the related disclosure, but not to limit the present disclosure. In addition, it should be noted that, for the convenience of description, only the parts related to the relevant disclosure are shown in the drawings.

Unless otherwise defined, all technical and scientific terms used herein have the same meaning as commonly understood by a person skilled in the art to which the present disclosure belongs. The terms used herein are only for the objective of describing the embodiments of the present disclosure, and are not intended to limit the present disclosure.

In the following description, reference is made to "some embodiments" which describe a subset of all possible embodiments, but it can be understood that "some embodiments" can be the same or a different subset of all possible embodiments, and can be combined with each other without conflict.

It should be pointed out that the term "first/second/third" involved in the embodiments of the present disclosure is only used to distinguish similar objects, and does not represent a specific ordering of objects. It is understandable that "first/second/third" may be interchanged where permitted in a specific order or sequence, so that the embodiments of the present disclosure described herein can be implemented in sequences other than those illustrated or described herein.

Dynamic Random Access Memory (DRAM) is a semiconductor memory device commonly used in computers, and is composed of many repeated memory cells. In DRAM, it needs to use an oscillator to generate a regular timing signal, and control a plurality of memory cells according to the timing signal. Therefore, the period detection of the oscillator is an important part of the quality detection of the memory chip.

There are many manners to test the oscillator inside the memory chip, which are roughly divided into two types. The first type is direct testing, which leads the output clock of the oscillator to the test machine. This test method is suitable for low-speed clocks. The second type is to output the internal clock period number after passing through the control logic, and calculate the period of the oscillator according to the operation time of the oscillator.

However, in the related art, the method for detecting the duration of the oscillation period still has shortcomings, resulting in low detection accuracy and low detection efficiency.

Based on this, the embodiments of the present disclosure provide an oscillation period detection circuit, the basic idea of which is as follows. The oscillation period detection circuit includes an oscillator module, a control module, and a counting module. The oscillator module includes a target oscillator and is configured to receive an enable signal and control the target oscillator to output an oscillation clock signal according to the enable signal; the control module is configured to receive the enable signal and the oscillation clock signal, and perform valid time reforming processing according to the oscillation clock signal and the enable signal to determine a target time; the counting module is configured to receive the enable signal and the oscillation clock signal, and perform period counting processing according to the enable signal and the oscillation clock signal to determine a target period number. The oscillation period of the target oscillator is calculated according to the target time and the target period number. In this way, the enable signal and the oscillation clock signal are subjected to the valid time reforming processing to determine the target time, and the enable signal and the oscillation clock signal are performed period counting to determine the target period number, and then the oscillation period can be calculated from the target time and the target period number. Therefore, the detection accuracy and detection efficiency of the oscillation period are improved.

The embodiments of the present disclosure will be described in detail below in combination with the accompanying drawings.

In an embodiment of the present disclosure. With reference to FIG. 1, FIG. 1 illustrates a schematic diagram of a structure of an oscillation period circuit according to an embodiment of the present disclosure. As illustrated in FIG. 1, the oscillation period detection circuit 10 includes an oscillator module 101, a control module 102, and a counting module 103.

The oscillator module 101 includes a target oscillator 1011, and is configured to receive an enable signal and control the target oscillator 1011 to output an oscillation clock signal according to the enable signal.

The control module 102 is configured to receive the enable signal and the oscillation clock signal, and perform valid time reforming processing according to the oscillation clock signal and the enable signal to determine a target time.

The counting module 103 is configured to receive the enable signal and the oscillation clock signal, and perform period counting processing according to the enable signal and the oscillation clock signal to determine a target period number.

The oscillation period of the target oscillator 1011 is calculated according to the target time and the target period number.

It should be noted that the oscillation period detection circuit according to the embodiments of the present disclosure can be applied to any electronic device involving an oscillator, such as a dynamic random access memory, a static random access memory, and the like.

In the embodiments of the present disclosure, the basic principle of the oscillation period detection circuit 10 is: the internal clock period number is output after passing through the control logic, and the period of the oscillator is calculated according to the operation time of the oscillator.

Specifically, the oscillation period detection circuit includes an oscillator module 101, a control module 102 and a counting module 103. The target oscillator 1011 in the oscillator module 101 outputs an oscillation clock signal according to the enable signal; the control module 102 performs valid time reforming processing on the enable signal according to the oscillation clock signal and output the target time; the counting module 103 performs period counting on the oscillation clock signal according to the enable signal, and determines the number of target periods. In this way, the oscillation period of the target oscillator 1011 can be calculated according to the target time and the target period number.

Figure 2:
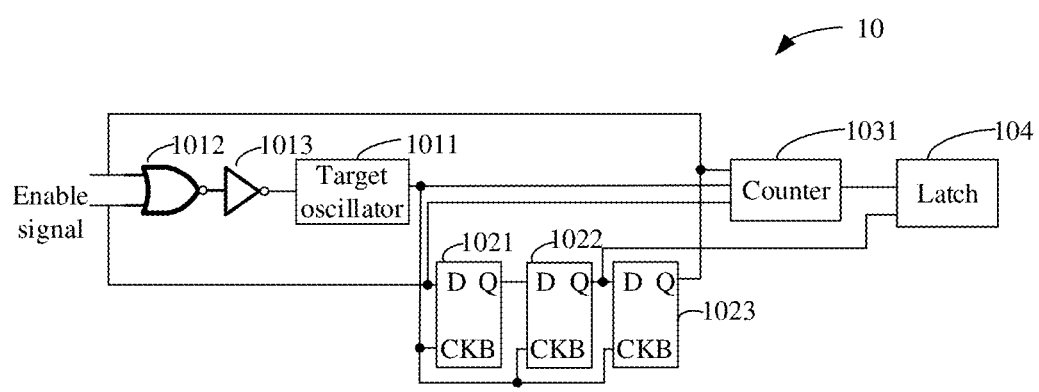
FIG. 2 illustrates a schematic diagram of a structure of another oscillation period circuit according to an embodiment of the present disclosure.

Furthermore, in some embodiments, with reference to FIG. 2, FIG. 2 illustrates a schematic diagram of a structure of another oscillation period detection circuit 10 according to an embodiment of the present disclosure. As illustrated in FIG. 2, the control module 102 includes a first flip-flop 1021, a second flip-flop 1022 and a third flip-flop 1023. The input terminal (D) of the first flip-flop 1021 is configured to receive the enable signal, the input terminal (D) of the second flip-flop 1022 is connected to the output terminal (Q) of the first flip-flop 1021, and the input terminal (D) of the third flip-flop 1023 is connected to the output terminal (Q) of the second flip-flop 1022. The clock terminal (CK) of the first flip-flop 1021, the clock terminal (CK) of the second flip-flop 1022 and the clock terminal (CK) of the third flip-flop 1023 are all configured to receive the oscillation clock signal.

The first flip-flop 1021 is specifically configured to perform sampling processing on the enable signal according to the oscillation clock signal, and output a first control signal.

The second flip-flop 1022 is configured to perform sampling processing on the first control signal according to the oscillation clock signal, and output a second control signal.

The third flip-flop 1023 is configured to perform sampling processing on the second control signal according to the oscillation clock signal, and output a third control signal;

Herein, the duration of the first control signal in a first level state is configured to determine the target time, and the target time is an integral multiple of the oscillation period of the target oscillator; the second control signal is configured to perform latch processing on the target period number when the first level state is flipped to a second level state, and the third control signal is configured to perform reset processing on the counting module 103 when the first level state is flipped to the second level state.

It should be noted that the control module 102 is composed of a first flip-flop 1021, a second flip-flop 1022 and a third flip-flop 1023, and the specific connection relationship thereof is illustrated in FIG. 2. A flip-flop is an electronic device that commonly appears in logic circuits. The flip-flop includes a clock terminal and an input terminal, receives an oscillation clock signal through the clock terminal, and performs sampling on the signal at the input terminal according to the oscillation clock signal.

The first flip-flop 1021, the second flip-flop 1022 and the third flip-flop 1023 may adopt flip-flops of various principles, and a person skilled in the art may select them according to actual application scenarios. Exemplarily, the first flip-flop 1021, the second flip-flop 1022 and the third flip-flop 1023 may all be D-type flip-flops, and the D-type flip-flops can perform sampling on the signal at the input terminal at the rising edge of the oscillation clock signal.

Figure 3:
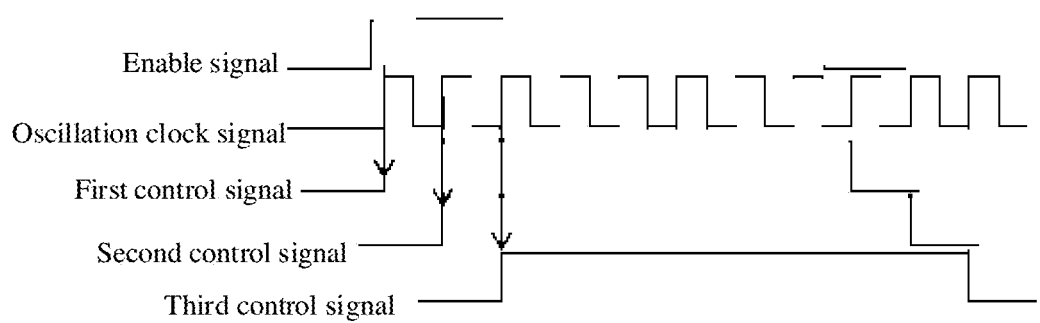
FIG. 3 illustrates a schematic diagram of a signal waveform of an oscillation period circuit according to an embodiment of the present disclosure.

With respect to the first flip-flop 1021, the enable signal is sampled at the rising edge of the oscillation clock signal, thereby outputting the first control signal. With reference to FIG. 3, FIG. 3 illustrates a schematic diagram of a signal waveform of an oscillation period circuit according to an embodiment of the present disclosure. As illustrated in FIG. 3, since the first flip-flop 1021 performs sampling only at the rising edge of the oscillation clock signal, the level state of the first control signal may change only at the rising edge of the oscillation clock signal. As such, the duration of the first control signal in the first level state must be an integral multiple of the oscillation period of the target oscillator 1011. That is to say, the first flip-flop 1021 is mainly configured to reform the valid time of the enable signal to be an integral multiple of the oscillation period (of the target oscillator), so as to determine the target time.

With respect to the second flip-flop 1022, the first control signal is sampled at the rising edge of the oscillation clock signal to output as the second control signal. As illustrated in FIG. 3, the valid time of the second control signal (the duration of being in the first level state) is delayed by one oscillation period (of the target oscillator) relative to the first control signal, and the second control signal is mainly configured to latch the target period number.

With respect to the third flip-flop 1023, the second control signal is sampled at the rising edge of the oscillation clock signal, and the output terminal is the third control signal. As illustrated in FIG. 3, the valid time of the third control signal (the duration of being in the first level state) is delayed by one oscillation period (of the target oscillator) relative to the second control signal, which is mainly configured to performing reset processing on the counting module 103.

Furthermore, in some embodiments, the oscillator module 101 is specifically configured to receive the enable signal and the third control signal, control the target oscillator 1011 to output the oscillation clock signal when the enable signal is in the first level state or the third control signal is in the first level state; and control the target oscillator 1011 to stop outputting the oscillation clock signal when both the enable signal and the third control signal are in a second level state. In this way, the enable signal and the third control signal are adopted to control the target oscillator at the same time, so as to prevent the target oscillator from stopping oscillating prematurely, which causes errors in the measurement process.

Therefore, in some embodiments, as illustrated in FIG. 2, the oscillator module 101 further includes a NOR gate 1012 and a NOT gate 1013.

The NOR gate 1012 is configured to perform a NOR operation on the third control signal and the enable signal to obtain a signal after operation.

The NOT gate 1013 is configured to perform a NOT operation on the signal after operation to obtain an enable control signal.

The target oscillator 1011 is configured to receive the enable control signal and output the oscillation clock signal according to the enable control signal.

It should be noted that, the third control signal and the enable signal perform a NOR operation and a NOT operation in sequence to obtain an enable control signal, and the enable control signal is configured to control the target oscillator 1011 to output a target oscillation signal.

Furthermore, in some embodiments, as illustrated in FIG. 2, the counting module 103 includes a counter 1031. An input terminal, a clock terminal and a reset terminal of the counter 1031 are respectively inputted with the enable signal, the oscillation clock signal and the third control signal connection.

The counter 1031 is configured to perform period counting processing on the oscillation clock signal and output a period counting signal when the enable signal is in a first level state. The period counting signal is configured to indicate the target period number. The counter 1031 is configured to perform reset processing when the third control signal is flipped from the first level state to the second level state.

It should be noted that the counting module 103 mainly includes a counter 1031. With respect to the counter 1031, the enable signal plays the role of gate control. In the case where the enable signal is valid (in the first level state), the counter 1031 can perform period counting on the oscillation clock signal, thereby outputting a period counting signal. In addition, with respect to the counter 1031, the third control signal is a reset signal. When the third control signal is flipped from the first level state to the second level state, the count value of the counter 1031 is cleared to zero.

Furthermore, in some embodiments, the oscillation period detection circuit 10 further includes a latch 104, and two input terminals of the latch are respectively inputted with the period counting signal and the second control signal.

The latch 104 is configured to perform latch processing on the period counting signal in the case where the second control signal is flipped from the first level state to the second level state, to achieve the latch processing of the target period number.

It should be noted that the input terminal of the latch 104 receives the period counting signal output by the counter 1031 and also receives the second control signal, and latches the period counting signal at the falling edge of the second control signal.

From the above, when the enable signal is in the first level state, the counter 1031 counts the period of the oscillation clock signal. At the falling edge of the second control signal, the latch 104 latches the period counting signal output by the counter 1031 latch to obtain the target period number. At the falling edge of the third control signal, the count value of the counter 1031 is cleared to zero.

It should also be noted that the first level state is a high level state, and the second level state is a low level state, but this does not constitute a limitation on the embodiments of the present disclosure.

Figure 4:
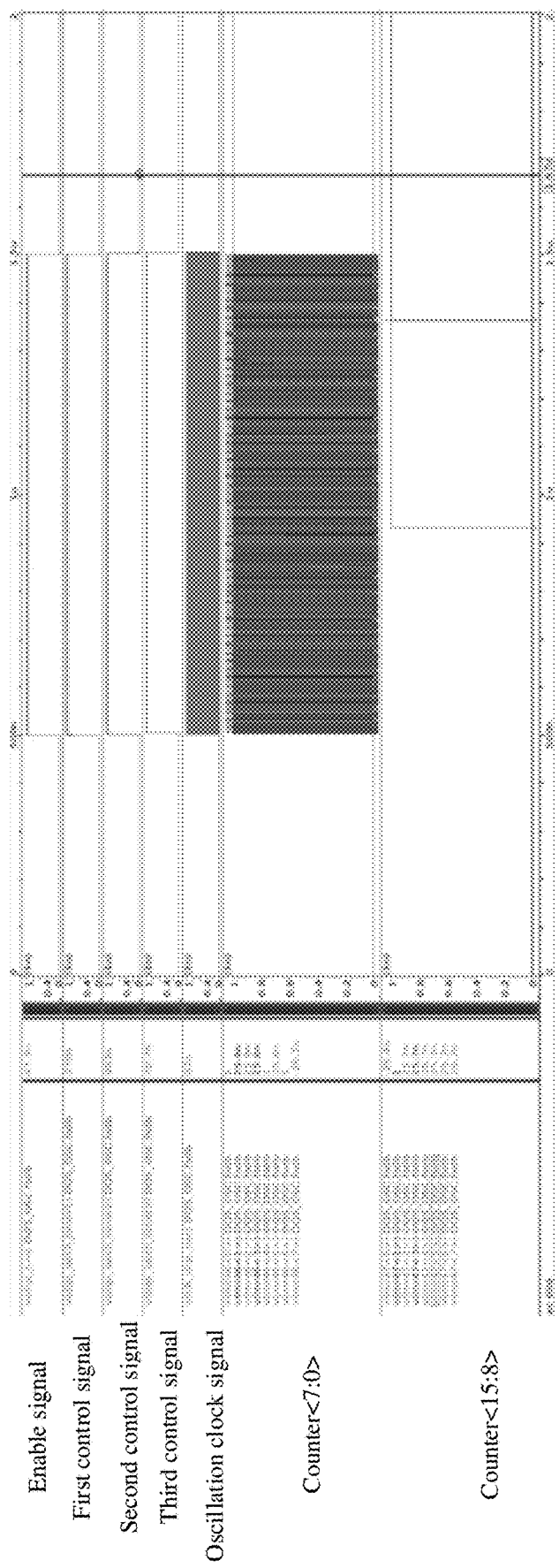
FIG. 4 illustrates a schematic diagram of a simulation test of an oscillation period circuit according to an embodiment of the present disclosure.

With reference to FIG. 4, FIG. 4 illustrates a schematic diagram of a simulation test of an oscillation period circuit according to an embodiment of the present disclosure. As illustrated in FIG. 4, two simulation experiments are adopted in the embodiments of the present disclosure. In the first simulation experiment, the target time is 1000 nanoseconds, and the period number is the simulation result of 592 (0000001001010000 in binary), so that the oscillation period can be calculated to be 1.69 nanoseconds. In the second simulation experiment, the oscillation period is the simulation result of 1.687 nanoseconds, the period number is calculated to be 593 (0000001001010001 in binary). It can be seen from the above that the results of the oscillation period circuit according to the embodiments of the present disclosure are more accurate.

TABLE 1

| | Period number (in binary form) | Oscillation period/ nanosecond | Note |
|---|---|---|---|
| First simulation experiment | 0000 0010 0101 0000 | 1.69 | The period number is the simulation result, the oscillation period is the calculation result, and the oscillation period = 1000 nanoseconds/target period number |
| Second simulation experiment | 0000 0010 0101 0001 | 1.687 | The period number is the calculation result, the oscillation period is the simulation result, the period number = 1000 nanoseconds/target oscillation period |

The embodiments of the present disclosure provide an oscillation period detection circuit. The oscillation period detection circuit includes an oscillator module, a control module, and a counting module. The oscillator module includes a target oscillator and is configured to receive an enable signal and control the target oscillator to output an oscillation clock signal according to the enable signal. The control module is configured to receive the enable signal and the oscillation clock signal, and perform valid time reforming processing according to the oscillation clock signal and the enable signal to determine a target time. The counting module is configured to receive the enable signal and the oscillation clock signal, and perform period counting processing according to the enable signal and the oscillation clock signal to determine a target period number. The oscillation period of the target oscillator is calculated according to the target time and the target period number. In this way, the embodiments of the present disclosure provide a novel circuit control structure, which is mainly applied to detect the period of the internal oscillator of the chip, and can also be regarded as an auxiliary circuit in the Propagation Delay Time (Tpd) test in Wafer Level Test (WAT). Specifically, the enable signal and the oscillation clock signal are subjected to the valid time reform processing to determine the target time, and the enable signal and the oscillation clock signal are performed period counting to determine the target period number, and then the oscillation period can be calculated from the target time and the target period number. Therefore, the detection accuracy and detection efficiency of the oscillation period are improved. In addition, the oscillation period detection circuit according to the embodiments of the present disclosure is suitable for both high-speed clocks and low-speed clocks, and has a wide range of application scenarios.

Figure 5:
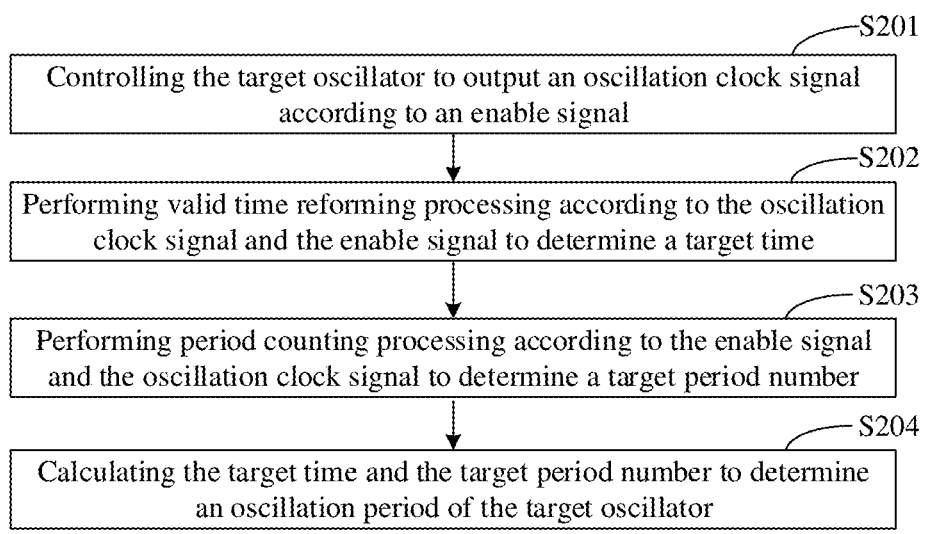
FIG. 5 illustrates a schematic flowchart of a method for detecting an oscillation period according to an embodiment of the present disclosure.

In another embodiment of the present disclosure, with reference to FIG. 5, FIG. 5 illustrates a schematic flowchart of a method for detecting an oscillation period according to an embodiment of the present disclosure. As illustrated in FIG. 5, the method includes the following operations.

In S201, the target oscillator is controlled to output an oscillation clock signal according to an enable signal.

It should be noted that the method for detecting an oscillation period in the embodiments of the present disclosure is applied to the above oscillation period detection circuit, and the oscillation period detection circuit includes a target oscillator. Here, the target oscillator can output an oscillation clock signal according to the enable signal. That is to say, the objective of the oscillation period detection method according to the embodiments of the present disclosure is to detect the period of the oscillation clock signal.

In S202, valid time reforming processing is performed according to the oscillation clock signal and the enable signal to determine a target time.

In S203, period counting processing is performed according to the enable signal and the oscillation clock signal to determine a target period number.

It should be noted that, valid clock reforming processing is performed on the enable signal by using the oscillation clock signal, the valid time of the enable signal is reformed to an integer multiple of the oscillation period, thereby obtaining the target time. Moreover, period counting processing is performed on the oscillation clock signal by using the enable signal, to obtain the target period number.

Specifically, in some embodiments, the oscillation period detection circuit may include a first flip-flop, a second flip-flop and a third flip-flop. Accordingly, the method may further include the following operations.

The enable signal and the oscillation clock signal are received through the first flip-flop, sampling processing is performed according to the oscillation clock signal and the enable signal, and a first control signal is outputted.

The first control signal and the oscillation clock signal are received through the second flip-flop, sampling processing is performed on the first control signal according to the oscillation clock signal, and a second control signal is outputted.

The second control signal and the oscillation clock signal are received through the third flip-flop, sampling processing is performed on the second control signal according to the oscillation clock signal, and a third control signal is outputted.

It should be noted that the first flip-flop samples the enable signal mainly at the rising edge of the oscillation clock signal to obtain the first control signal, so that the valid time of the enable signal is readjusted to an integer multiple of the oscillation period of the target oscillator, which is convenient for subsequent calculations. That is to say, the duration of the first control signal in the first level state is used to determine the target time, and the target time is an integral multiple of the oscillation period of the target oscillator.

The second flip-flop samples the first control signal mainly at the rising edge of the oscillation clock signal to obtain the second control signal. The valid time of the second control signal is delayed by one oscillation period (of the target oscillator) compared to the first control signal, so as to be used to latch the target period number. That is to say, the second control signal is configured to perform latch processing on the target period number when the first level state is flipped to the second level state.

The third flip-flop samples the second control signal mainly at the rising edge of the oscillation clock signal to obtain the third control signal, and the valid time of the third control signal is delayed by one oscillation period (of the target oscillator) compared to the second control signal, and the third control signal is configured to perform reset processing on the counting module. That is to say, the third control signal is configured to perform reset process when the first level state is flipped to the second level state.

In the above description, the valid time of the signal refers to the time when the signal is in the first level state.

Furthermore, in some embodiments, the operation of controlling the target oscillator to output an oscillation clock signal according to an enable signal may include:
the target oscillator is controlled to output the oscillation clock signal when the enable signal is in the first level state or the third control signal is in the first level state; and
the target oscillator is controlled to stop outputting the oscillation clock signal when both the enable signal and the third control signal are in the second level state.

It should be noted that the enable signal and the third control signal are used to control the target oscillator at the same time, so as to prevent the target oscillator from stopping oscillating prematurely, which causes errors in the measurement process.

In a specific embodiment, the oscillation period detection circuit further includes a counter and a latch. Accordingly, the operation of performing period counting processing according to the enable signal and the oscillation clock signal to determine the target period number may include:
period counting processing is performed on the oscillation clock signal through the counter and a period counting signal is outputted when the enable signal is in the first level state, the period counting signal being configured to indicate the target period number; and
latch processing is performed on the period counting signal through the latch in the case where the second control signal is flipped from the first level state to the second level state, to achieve the latch processing of the target period number.

It should be noted that, when the enable signal is valid, the counter performs period counting on the oscillation clock signal and outputs the period counting signal. At the same time, at the falling edge of the second control signal, the latch latches the period counting signal to obtain the target period number.

It should be noted that the reset terminal of the counter is inputted with the third control signal. Therefore, in some embodiments, the method may further include:
the counter is controlled to perform reset processing when the third control signal is flipped from the first level state to the second level state.

In this way, after each test is completed, the count value of the counter will be reset to zero, waiting for the next test.

Furthermore, in some embodiments, the operation of controlling the target oscillator to output an oscillation clock signal according to an enable signal may include:
a NOR operation is performed on the third control signal and the enable signal to obtain a signal after operation;
a NOT operation is performed on the signal after operation to obtain an enable control signal; and
the target oscillator is controlled to output the oscillation clock signal according to the enable control signal.

It should be noted that the third control signal and the enable signal after the NOR operation and the NOT operation are configured to control the oscillation clock signal. In this way, when both the third control signal and the enable signal are in the second level state, the enable control signal is in the second level state, and the target oscillator stops outputting the target oscillation signal. When the third control signal is in the first level state or the enable signal is in the first level state, the enable control signal is in the first level state, and the target oscillator outputs the target oscillation signal.

In this way, through the above processing, the target period number of the oscillation clock signal within the target time can be obtained.

In S204, the target time and the target period number are calculated to determine the oscillation period of the target oscillator.

It should be noted that, after obtaining the target time and the target period number, the oscillation period of the target oscillator can be determined through a simple operation.

Specifically, the operation of calculating the target time and the target period number to determine the oscillation period of the target oscillator may include:
the target time is divided by the target period number to obtain the oscillation period of the target oscillator.

It should be noted that the oscillation period of the target oscillator=target time/target period number.

In another embodiment, since the first count value of the counter is 0, the exact period number of the oscillation period signal is actually (target period number+1). That is to say, the exact oscillation period=target time/(target period number+1). However, in a test, the number of oscillation periods is generally large, and the target period number can be used to instead of (target period number+1) for calculation, and the error is within the allowable range.

It should also be noted that the first level state is a high level state, and the second level state is a low level state.

The embodiments of the present disclosure provide a method for detecting an oscillation period. In this method, the target oscillator is controlled to output an oscillation clock signal according to an enable signal; valid time reforming processing is performed according to the oscillation clock signal and the enable signal to determine a target time; period counting processing is performed according to the enable signal and the oscillation clock signal to determine the target period number; and the target time and the target period number are calculated to determine the oscillation period of the target oscillator. In this way, the enable signal and the oscillation clock signal are subjected to the valid time reforming processing to determine the target time, and the enable signal and the oscillation clock signal are performed period counting to determine the target period number, and then the oscillation period can be calculated from the target time and the target period number. Therefore, the detection accuracy and detection efficiency of the oscillation period are improved.

Figure 6:
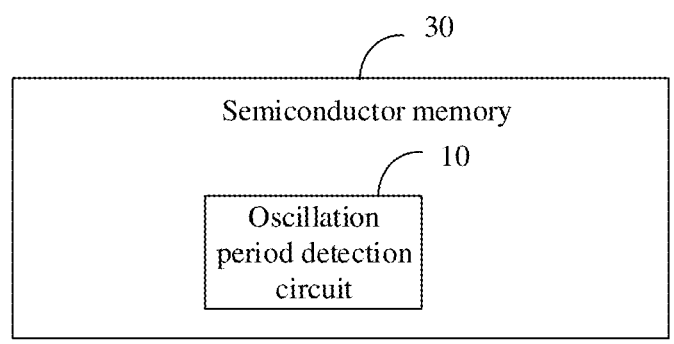
FIG. 6 illustrates a schematic diagram of a structure of a semiconductor memory according to an embodiment of the present disclosure.

In yet another embodiment of the present disclosure, with reference to FIG. 6, FIG. 6 illustrates a semiconductor memory 30 according to an embodiment of the present disclosure. The semiconductor memory 30 at least includes the above oscillation period detection circuit 10.

With respect to the semiconductor memory 30, since it includes the oscillation period detection circuit 10, during the oscillation period detection process, the valid time reforming processing is performed by using the enable signal and the oscillation clock signal to determine the target time, and the enable signal and the oscillation clock are performed the period counting to determine the target period number, and then the oscillation period can be calculated by the target time and the target period number, thereby improving the detection accuracy and detection efficiency of the oscillation period.

In still another embodiment of the present disclosure, an electronic device is provided, and the electronic device includes at least the above semiconductor memory 30.

With respect to the electronic device, since it includes the semiconductor memory 30, during the oscillation period detection process, the valid time reforming processing is performed by using the enable signal and the oscillation clock signal to determine the target time, and the enable signal and the oscillation clock signal are performed period counting to determine the target period number, and then the oscillation period can be subsequently calculated by the target time and the target period number, thereby improving the detection accuracy and detection efficiency of the oscillation period.

The above descriptions are only preferred embodiments of the present disclosure, and are not intended to limit the protection scope of the present disclosure It should be noted that, in the present disclosure, the terms "including", "containing" or any other variation thereof are intended to encompass non-exclusive inclusion, such that a process, method, article or apparatus including a series of elements includes not only those elements, but also other elements not expressly listed or inherent to such a process, method, article or apparatus. Without further limitation, an element defined by the phrase "including a . . . " does not preclude the presence of additional identical elements in a process, method, article or apparatus that includes the element.

The above serial numbers in the embodiments of the present disclosure are only for description, and do not represent the advantages or disadvantages of the embodiments.

The methods disclosed in the several method embodiments according to the present disclosure can be arbitrarily combined under the condition of no conflict to obtain a new method embodiment.

The features disclosed in the several product embodiments according to the present disclosure can be combined arbitrarily without conflict to obtain a new product embodiment.

The features disclosed in several method or equipment embodiments according to the present disclosure can be combined arbitrarily without conflict to obtain a new method embodiment or an equipment embodiment.

The above are only specific embodiments of the present disclosure, but the protection scope of the present disclosure is not limited to this. Any person skilled in the art would easily conceive of changes or substitutions within the technical scope disclosed in the present disclosure, which should be covered by the protection scope of the present disclosure. Therefore, the protection scope of the present disclosure should be subject to the protection scope of the claims.

INDUSTRIAL APPLICABILITY

The embodiments of the present disclosure provide an oscillation period detection circuit and method, and semiconductor memory. The oscillation period detection circuit includes an oscillator module, a control module, and a counting module. The oscillator module includes a target oscillator and is configured to receive an enable signal and control the target oscillator to output an oscillation clock signal according to the enable signal; the control module is configured to receive the enable signal and the oscillation clock signal, and perform valid time reforming processing according to the oscillation clock signal and the enable signal to determine a target time; the counting module is configured to receive the enable signal and the oscillation clock signal, and perform period counting processing according to the enable signal and the oscillation clock signal to determine a target period number. The oscillation period of the target oscillator is calculated according to the target time and the target period number. In this way, the enable signal and the oscillation clock signal are subjected to valid time reforming processing to determine the target time, and the enable signal and the oscillation clock signal are performed period counting to determine the target period number, and then the oscillation period can be calculated from the target time and the target period number. Therefore, the detection accuracy and detection efficiency of the oscillation period are improved.

The invention claimed is:

1. An oscillation period detection circuit, comprising:
an oscillator module, comprising a target oscillator, configured to receive an enable signal, and control the target oscillator to output an oscillation clock signal according to the enable signal;
a control module, configured to receive the enable signal and the oscillation clock signal, and perform valid time reforming processing according to the oscillation clock signal and the enable signal to determine a target time; and
a counting module, configured to receive the enable signal and the oscillation clock signal, and perform period counting processing according to the enable signal and the oscillation clock signal to determine a target period number; and,
wherein an oscillation period of the target oscillator is calculated according to the target time and the target period number;
the control module comprises a first flip-flop, a second flip-flop and a third flip-flop, and an input terminal (D) of the first flip-flop is configured to receive the enable signal, an input terminal (D) of the second flip-flop is connected to an output terminal (Q) of the first flip-flop, and an input terminal (D) of the third flip-flop is connected to an output terminal (Q) of the second flip-flop, and a clock terminal (CK) of the first flip-flop, a clock terminal (CK) of the second flip-flop and a clock terminal (CK) of the third flip-flop are all configured to receive the oscillation clock signal;
the first flip-flop is specifically configured to perform sampling processing on the enable signal according to the oscillation clock signal, and output a first control signal;
the second flip-flop is configured to perform sampling processing on the first control signal according to the oscillation clock signal, and output a second control signal;
the third flip-flop is configured to perform sampling processing on the second control signal according to the oscillation clock signal, and output a third control signal;
the duration of the first control signal in a first level state is configured to determine the target time, and the target time is an integral multiple of the oscillation period of the target oscillator; the second control signal is configured to perform latch processing on the target period number when the first level state is flipped to a second level state, and the third control signal is configured to perform reset processing on the counting module when the first level state is flipped to the second level state; and
the oscillator module is further configured to receive the enable signal and the third control signal, control the target oscillator to output the oscillation clock signal when the enable signal is in the first level state or the third control signal is in the first level state; and control the target oscillator to stop outputting the oscillation clock signal when both the enable signal and the third control signal are in the second level state.

2. The oscillation period detection circuit according to claim 1, wherein the counting module comprises a counter, and an input terminal, a clock terminal and a reset terminal of the counter are respectively inputted with the enable signal, the oscillation clock signal and the three control signal; wherein the counter is configured to perform period counting processing on the oscillation clock signal and output a period counting signal when the enable signal is in the first level state, the period counting signal is configured to indicate the target period number; and the counter is configured to perform reset processing when the third control signal is flipped from the first level state to the second level state.

3. The oscillation period detection circuit according to claim 2, wherein the oscillation period detection circuit further comprises a latch, and two input terminals of the latch are respectively inputted with the period counting signal and the second control signal; wherein the latch is configured to perform latch processing on the period counting signal in a case where the second control signal is flipped from the first level state to the second level state, to achieve the latch processing of the target period number.

4. The oscillation period detection circuit according to claim 1, wherein the oscillator module further comprises a NOR gate and a NOT gate;

the NOR gate is configured to perform a NOR operation on the third control signal and the enable signal to obtain a signal after operation;

the NOT gate is configured to perform a NOT operation on the signal after operation to obtain an enable control signal; and the target oscillator is configured to receive the enable control signal, and output the oscillation clock signal according to the enable control signal.

5. The oscillation period detection circuit according to claim 1, wherein the first flip-flop, the second flip-flop and the third flip-flop are all D-type flip-flops.

6. The oscillation period detection circuit according to claim 1, wherein the first level state is a high level state, and the second level state is a low level state.

7. A method for detecting an oscillation period, applied to an oscillation period detection circuit comprising a target oscillator, the method comprising:

controlling the target oscillator to output an oscillation clock signal according to an enable signal;

performing valid time reforming processing according to the oscillation clock signal and the enable signal to determine a target time;

performing period counting processing according to the enable signal and the oscillation clock signal to determine a target period number; and calculating the target time and the target period number to determine an oscillation period of the target oscillator; and, wherein the oscillation period detection circuit comprises a first flip-flop, a second flip-flop and a third flip-flop; the method further comprises:

receiving the enable signal and the oscillation clock signal through the first flip-flop, performing sampling processing according to the oscillation clock signal and the enable signal, and outputting a first control signal;

receiving the first control signal and the oscillation clock signal through the second flip-flop, performing sampling processing on the first control signal according to the oscillation clock signal, and outputting a second control signal;

receiving the second control signal and the oscillation clock signal through the third flip-flop, performing sampling processing on the second control signal according to the oscillation clock signal, and outputting a third control signal;

the duration of the first control signal in a first level state is configured to determine the target time, and the target time is an integral multiple of the oscillation period of the target oscillator; the second control signal is configured to perform latch processing on the target period number when the first level state is flipped to a second level state, and the third control signal is configured to perform reset processing when the first level state is flipped to the second level state; and, controlling the target oscillator to output the oscillation clock signal according to the enable signal comprises:

controlling the target oscillator to output the oscillation clock signal when the enable signal is in the first level state or the third control signal is in the first level state; and controlling the target oscillator to stop outputting the oscillation clock signal when both the enable signal and the third control signal are in the second level state.

8. The method for detecting an oscillation period according to claim 7, wherein the oscillation period detection circuit comprises a counter and a latch, and performing period counting processing on the oscillation clock signal according to the enable signal to determine the target period number comprises:

performing period counting processing on the oscillation clock signal through the counter and outputting a period counting signal when the enable signal is in the first level state, the period counting signal being configured to indicate the target period number; and performing latch processing on the period counting signal through the latch in a case where the second control signal is flipped from the first level state to the second level state, to achieve the latch processing of the target period number.

9. The method for detecting an oscillation period according to claim 8, wherein the method further comprises:

controlling the counter to perform a reset processing when the third control signal is flipped from the first level state to the second level state.

10. The method for detecting an oscillation period according to claim 8, wherein controlling the target oscillator to output the oscillation clock signal according to the enable signal comprises:

performing a NOR operation on the third control signal and the enable signal to obtain a signal after operation;

performing a NOT operation on the signal after operation to obtain an enable control signal; and controlling the target oscillator to output the oscillation clock signal according to the enable control signal.

11. The method for detecting an oscillation period according to claim 7, wherein calculating the target time and the target period number to determine the oscillation period of the target oscillator comprises:

dividing the target time by the target period number to obtain the oscillation period of the target oscillator.

12. The method for detecting an oscillation period according to claim 7, wherein the first level state is a high level state, and the second level state is a low level state.

13. A semiconductor memory comprising at least an oscillation period detection circuit, wherein the oscillation period detection circuit comprises:
- an oscillator module, comprising a target oscillator, configured to receive an enable signal, and control the target oscillator to output an oscillation clock signal according to the enable signal;
- a control module, configured to receive the enable signal and the oscillation clock signal, and perform valid time reforming processing according to the oscillation clock signal and the enable signal to determine a target time; and
- a counting module, configured to receive the enable signal and the oscillation clock signal, and perform period counting processing according to the enable signal and the oscillation clock signal to determine a target period number;
- wherein an oscillation period of the target oscillator is calculated according to the target time and the target period number; and,
- wherein the control module comprises a first flip-flop, a second flip-flop and a third flip-flop, and an input terminal (D) of the first flip-flop is configured to receive the enable signal, an input terminal (D) of the second flip-flop is connected to an output terminal (Q) of the first flip-flop, and an input terminal (D) of the third flip-flop is connected to an output terminal (Q) of the second flip-flop, and a clock terminal (CK) of the first flip-flop, a clock terminal (CK) of the second flip-flop and a clock terminal (CK) of the third flip-flop are all configured to receive the oscillation clock signal;
- the first flip-flop is specifically configured to perform sampling processing on the enable signal according to the oscillation clock signal, and output a first control signal;
- the second flip-flop is configured to perform sampling processing on the first control signal according to the oscillation clock signal, and output a second control signal;
- the third flip-flop is configured to perform sampling processing on the second control signal according to the oscillation clock signal, and output a third control signal;
- the duration of the first control signal in a first level state is configured to determine the target time, and the target time is an integral multiple of the oscillation period of the target oscillator; the second control signal is configured to perform latch processing on the target period number when the first level state is flipped to a second level state, and the third control signal is configured to perform reset processing on the counting module when the first level state is flipped to the second level state; and
- the oscillator module is specifically configured to receive the enable signal and the third control signal, control the target oscillator to output the oscillation clock signal when the enable signal is in the first level state or the third control signal is in the first level state; and control the target oscillator to stop outputting the oscillation clock signal when both the enable signal and the third control signal are in the second level state.

14. The semiconductor memory according to claim 13, wherein the counting module comprises a counter, and an input terminal, a clock terminal and a reset terminal of the counter are respectively inputted with the enable signal, the oscillation clock signal and the three control signal; wherein
- the counter is configured to perform period counting processing on the oscillation clock signal and output a period counting signal when the enable signal is in the first level state, the period counting signal is configured to indicate the target period number; and the counter is configured to perform reset processing when the third control signal is flipped from the first level state to the second level state.

* * * * *